United States Patent
Jung et al.

(10) Patent No.: US 12,125,526 B2
(45) Date of Patent: Oct. 22, 2024

(54) MEMORY WITH BITCELL POWER BOOSTING

(71) Applicant: QUALCOMM Incorporated, San Diego, CA (US)

(72) Inventors: Chulmin Jung, San Diego, CA (US); Xiao Chen, San Diego, CA (US); Chi-Jui Chen, San Diego, CA (US); Anil Chowdary Kota, San Diego, CA (US); Dhvani Sheth, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 184 days.

(21) Appl. No.: 17/657,231

(22) Filed: Mar. 30, 2022

(65) Prior Publication Data

US 2023/0317150 A1 Oct. 5, 2023

(51) Int. Cl.
G11C 5/14 (2006.01)
G11C 11/412 (2006.01)
G11C 11/419 (2006.01)

(52) U.S. Cl.
CPC .......... G11C 11/419 (2013.01); G11C 11/412 (2013.01)

(58) Field of Classification Search
CPC ............................ G11C 11/419; G11C 11/412
USPC .......................................................... 365/156
See application file for complete search history.

(56) References Cited

U.S. PATENT DOCUMENTS

| 6,307,805 | B1 * | 10/2001 | Andersen | G11C 11/418 |
| | | | | 257/E27.098 |
| 6,346,846 | B1 * | 2/2002 | Bertin | G11C 17/18 |
| | | | | 327/525 |
| 6,845,046 | B1 * | 1/2005 | Ishikawa | G11C 5/147 |
| | | | | 365/185.08 |
| 7,696,812 | B2 * | 4/2010 | Al-Shamma | H02M 3/073 |
| | | | | 327/536 |
| 7,742,326 | B2 | 6/2010 | Houston | |
| 7,840,112 | B2 * | 11/2010 | Rao | G11B 27/329 |
| | | | | 386/291 |
| 8,233,342 | B2 * | 7/2012 | Adams | G11C 11/419 |
| | | | | 365/204 |
| 8,619,463 | B2 * | 12/2013 | Cheng | G11C 8/08 |
| | | | | 365/230.06 |
| 9,236,116 | B1 | 1/2016 | Braceras et al. | |
| 9,245,595 | B2 * | 1/2016 | Felix | G11C 5/145 |
| 9,281,311 | B2 * | 3/2016 | Wu | G11C 7/12 |
| 9,343,140 | B2 | 5/2016 | Chen et al. | |
| 9,460,776 | B2 | 10/2016 | Dally | |
| 9,570,118 | B2 * | 2/2017 | Lee | G11C 8/08 |
| 9,837,144 | B1 * | 12/2017 | Sinha | G11C 5/14 |
| 9,842,634 | B2 * | 12/2017 | Jeong | G11C 11/419 |

(Continued)

OTHER PUBLICATIONS

Arijit Banerjee et al, "A 256kb 6T self-tuning SRAM with extended 0.38v-1.2v operating range using multiple read/write assists with VMIN tracking canary sensors", May 2017, IEEE/CICC paper. (Year: 2017).*

(Continued)

Primary Examiner — Viet Q Nguyen
(74) Attorney, Agent, or Firm — Haynes and Boone, LLP (57) ABSTRACT

A memory is provided that includes bitcell VDD boosting to increase a read margin. In some implementations, the positive boost for the bitcell VDD may be provided by a capacitor that is also used for negative boosting of a write driver.

21 Claims, 7 Drawing Sheets

(56) References Cited

U.S. PATENT DOCUMENTS

| | | | |
|---|---|---|---|
| 9,865,337 B1* | 1/2018 | Ahmed | G11C 5/14 |
| 9,875,790 B1* | 1/2018 | Sinha | G11C 11/419 |
| 9,921,596 B2* | 3/2018 | Ben Artsi | G05F 1/613 |
| 10,128,846 B2* | 11/2018 | Mallavajula | H03K 17/063 |
| 10,199,092 B2 | 2/2019 | Chanana et al. | |
| 10,381,054 B1 | 8/2019 | Sreenivasula et al. | |
| 10,553,274 B2* | 2/2020 | McCombs | G11C 5/145 |
| 10,614,865 B1* | 4/2020 | Mohanty | G11C 7/18 |
| 11,049,552 B1* | 6/2021 | Raj | G11C 11/4091 |
| 11,568,904 B1* | 1/2023 | Lee | G11C 7/1078 |
| 11,651,816 B2* | 5/2023 | Cosemans | G11C 11/419 365/185.13 |
| 11,657,238 B2* | 5/2023 | Srivastava | G11C 11/419 708/523 |
| 2008/0043540 A1* | 2/2008 | Boemler | H04N 25/76 365/189.11 |
| 2013/0286717 A1* | 10/2013 | Adams | G11C 11/419 716/102 |
| 2015/0179232 A1 | 6/2015 | Felix et al. | |
| 2017/0294223 A1 | 10/2017 | Zhang et al. | |

OTHER PUBLICATIONS

Banerjee A., et al., "A 256kb 6T Self-tuning SRAM with Extended 0.38V-1.2V Operating Range Using Multiple Read/Write Assists and VMIN Tracking Canary Sensors", 2017 IEEE Custom Integrated Circuits Conference (CICC), Apr. 30, 2017, pp. 1-4, XP033130617, DOI: 10.1109/CICC.2017.7993688, Figure 2b.
International Search Report and Written Opinion—PCT/US2023/015374—ISA/EPO—Jun. 29, 2023.

* cited by examiner

MEMORY WITH BITCELL POWER BOOSTING

TECHNICAL FIELD

This application relates to memories, and more particularly to memories with positively boosted power at the bitcells.

BACKGROUND

In a conventional static random-access memory (SRAM), a bitcell connects to a pair of bit lines. Prior to a write operation, the bit lines are pre-charged to the power supply voltage used for the bitcell. Depending upon the data to be written to the bitcell, a write multiplexer may discharge either the true bit line or the complement bit line in the bit line pair from its pre-charged state.

Some conventional SRAM devices may further employ a word line underdrive (WLUD) in order to mitigate a read static noise margin loss from a lower power supply level. However, word line underdrive may lead to a lower read current in a memory cell, which may itself decrease read performance.

There is a need in the art for memories having increased read performance.

SUMMARY

In one implementation, a circuit includes: a random-access memory (RAM) cell coupled to a first power rail; and a boost circuit coupled to the first power rail, the boost circuit including a capacitor having a first terminal and a second terminal, the first terminal of the capacitor being coupled to a first power supply through a first transistor and being coupled to a ground through a second transistor, the second terminal of the capacitor being coupled to a first plurality of parallel transistors, the first plurality of parallel transistors being coupled to a plurality of power rails that includes the first power rail, and a second plurality of parallel transistors coupled to the plurality of power rails and to a second power supply.

In another implementation, a method includes: coupling a first terminal of a capacitor to ground through a first transistor, wherein a second terminal of the capacitor is coupled to a node that is floating and charged to a power supply voltage; de-coupling the first terminal from ground; coupling the first terminal to a power supply through a second transistor; coupling the second terminal to a power rail through a third transistor, the power rail serving a memory bank; and boosting the power supply voltage for a memory cell of the memory bank, including discharging the capacitor onto the power rail.

In another implementation, a random access memory (RAM) includes a first memory bank having a plurality of bit cells arranged in columns and rows; means for conforming a voltage level of input data to a level compatible with writing to the first memory bank; means for detecting output data read from the first memory bank; means for providing a negative boost to the means for conforming the voltage level; and means for providing a positive boost to power rails coupled to memory cells in the first memory bank.

In yet another implementation, system on chip (SOC) includes a random access memory having a write driver and a memory bank; a plurality of power rails, each of the power rails corresponding to a respective core within the memory bank, each of the power rails being coupled to power inputs of memory cells within the respective cores; and a boost circuit coupled to the write driver and to the memory bank, wherein the boost circuit includes a capacitor having a first terminal and a second terminal, the capacitor being coupled between a power supply and a first node, the first node being coupled to the second terminal and to the plurality of power rails.

These and additional advantages may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

An example write operation includes negative boosting at a write driver so that the binary data includes a binary zero that is pulled lower by the negative boosting. The purpose is to pull either the bit line or the complement bit line lower than it would go otherwise to increase write margin. In other words, the negative boosting makes a difference between the bit line and the complement bit line larger than it would otherwise be, thereby decreasing the chances of a failed write operation.

Also, as noted above, word line underdrive (WLUD) may be used in combination with a lowering of power supply (VDD) to mitigate a read static noise margin loss from the lower VDD. However, WLUD may still leave read static noise margin lower than may be desirable for some implementations.

Accordingly, various implementations boost VDD at the memory bit cells of the memory banks during read operations to increase an amount of read current and, thereby, increase the read static noise margin.

An example circuit may include boost circuitry coupled to memory cells (e.g., static random-access memory bit cells) and configured to boost VDD of those memory cells. Continuing with the example, the boost circuitry may include a capacitor having a first terminal and a second terminal, the first terminal being coupled to a first power supply through a first transistor and being coupled to ground through a second transistor. The second terminal of the capacitor is coupled to a first plurality of parallel transistors, where the first plurality of transistors is coupled to a plurality of power rails. The plurality of power rails are coupled to columns of bit cells and configured to provide power to the columns of bit cells. The boost circuit may also include a second plurality of parallel transistors between the plurality of power rails and an external power supply.

Therefore, the capacitor may be used to boost a voltage at the plurality of power rails by charging and discharging the capacitor in parallel with turning on or off the first and second plurality of transistors. In other words, the capacitor may be used to boost VDD at the plurality of power rails, the power rails supplying power to the memory cells.

An advantage of some implementations is that the positive boost VDD may increase an amount of read current in a selected memory cell. The increase in the read current may correspond to an increase in read static noise margin. Increasing read static noise margin may further increase performance of the device by allowing for dependable read operations at greater speeds even if VDD may be lowered when not actively reading. Furthermore, lowering VDD may provide for an increase in power efficiency, which when coupled with VDD boosting for read operations may provide the increase in power efficiency without a negative effect on dependability and speed.

In some implementations, the capacitor may be shared with negative boosting circuitry that provides a negative boost to the write driver. Thus, the memory device may include both positive boosting for VDD and negative boosting for the write driver. An advantage of some implementations is that the dual use for the capacitor may come at a negligible cost for semiconductor area. Thus, some implementations may enjoy the benefits of both positive boosting and negative boosting with little or negligible impact on device size.

Figure 1:
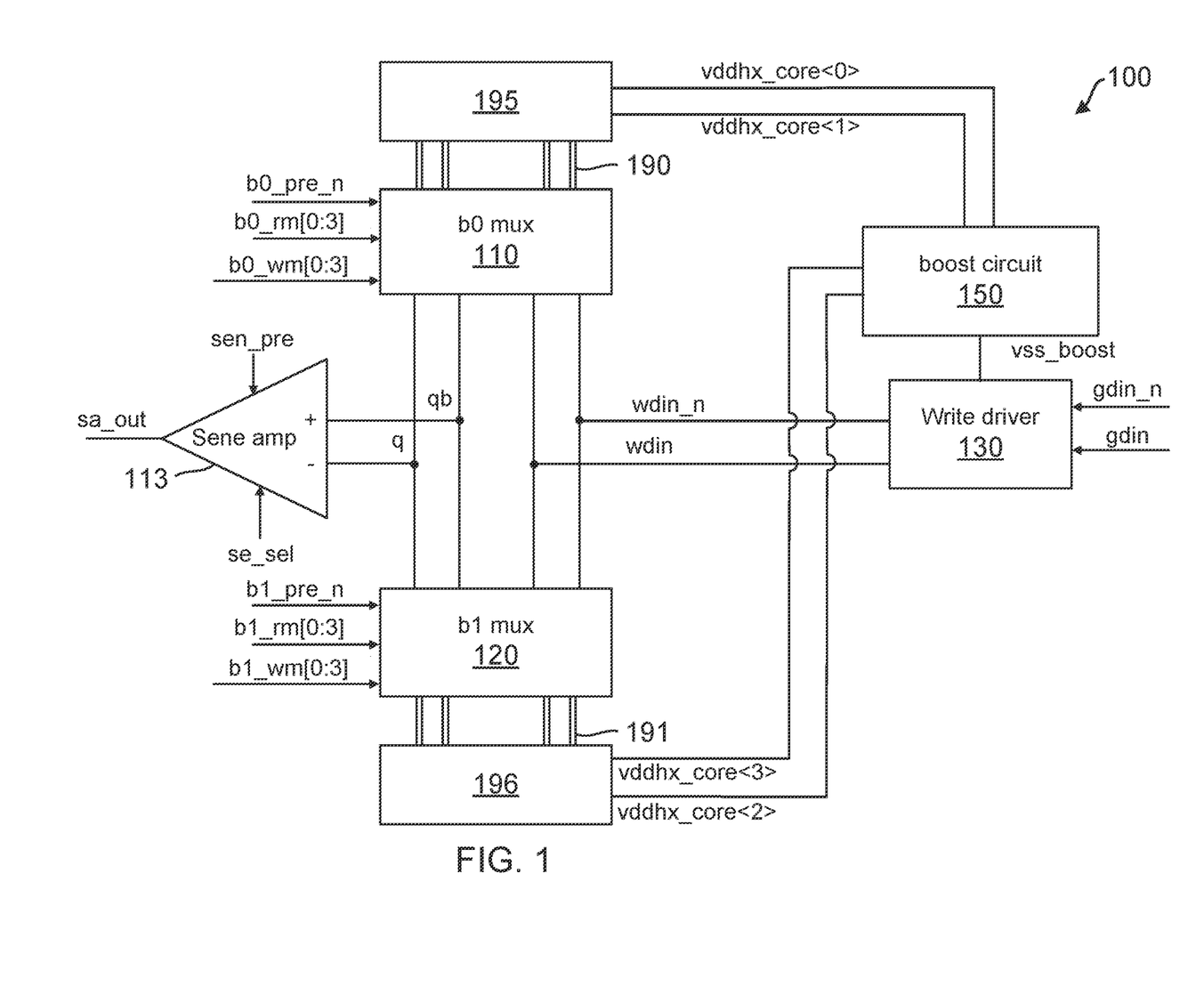
FIG. 1 illustrates a multi-bank memory with boosting, according to one implementation.

FIG. 1 is an illustration of a memory system 100, according to one implementation. Memory system 100 is a multi-bank memory system, in this case using two memory banks, namely, bank b0 195, and bank b1 196. As one of skill in the art would appreciate, the boosting techniques disclosed herein can be applied to multi-bank memory system having any number of memory banks. Each of the memory banks 195, 196 includes multiple columns of bit cells, each column having a bit line and a complementary bit line, and each of the memory banks traversed by multiple word lines. Bit lines and complementary bit lines 190, 191 are illustrated as each having four pairs, and it is understood that a given memory bank may include any appropriate number of bit line pairs corresponding to any appropriate number of columns.

Looking at multiplexer 110, it corresponds to bank b0 195, and it multiplexes the bit line pairs 190 onto the data inputs wdin, wdin_n as well as sense nodes q and qb. Similarly, multiplexer 120 corresponds to bank b1 196, and it multiplexes the bit line pairs 191 onto the data inputs wdin, wdin_n as well as the sense nodes q, qb. In this example, each of the multiplexers 110, 120 receives three signals, including pre_n (bit line pre-charging), rm [0:3] (a read multiplexing signal), and wm [0:3] (a write multiplexing signal). It is noted here that the signals rm and wm are shown as selecting among four columns, and as noted above, the scope of implementations supports any number of columns that may be multiplexed.

The sense node q and complementary sense node qb are inputs to the sense amplifier 113. Further in this example, memory system 100 performs either a read or a write operation on one of the memory banks 195, 196 at a given time and does not perform operations simultaneously on both memory banks 195, 196. Sense amplifier 113 bases a bit decision upon a difference in voltage between a given sense node pair corresponding to one of the memory banks 195, 196 in response to a read operation on that respective bank. Output of the sense amplifier 113 is sa_out, and it is indicative of a value read from a bit cell.

Write operations may include receiving differential data on gdin, gdin_n from a data source (not shown). The write driver 130 conforms a voltage level of the differential data to a level compatible with writing to the memory banks 195, 196. The voltage level shifted data wdin, wdin_n is sent to multiplexers 110, 120. One of the multiplexers 110, 120 has a column that is selected by the signal wm to write the data to its respective memory bank 195, 196. For instance, with respect to multiplexer 110, there are four wm signals [0:3], and the three unselected columns correspond to a digital 0 value, and the one selected column corresponds to a digital 1 value. The same is true for multiplexer 120.

Boost circuit 150 provides, through write driver 130, a negative boost to one of the differential data portions that is a digital 0. The negative boost is illustrated by vss_boost, which is described in more detail with respect to FIG. 3. The negative boost of the data may increase the write margin experienced by the memory banks 195, 196. Boost circuit 150 may also provide a positive boost to VDD at the memory cells using power rails vddhx_core<0-3>. The positive boost to VDD at the memory cells may increase read static noise margin.

Figure 2:
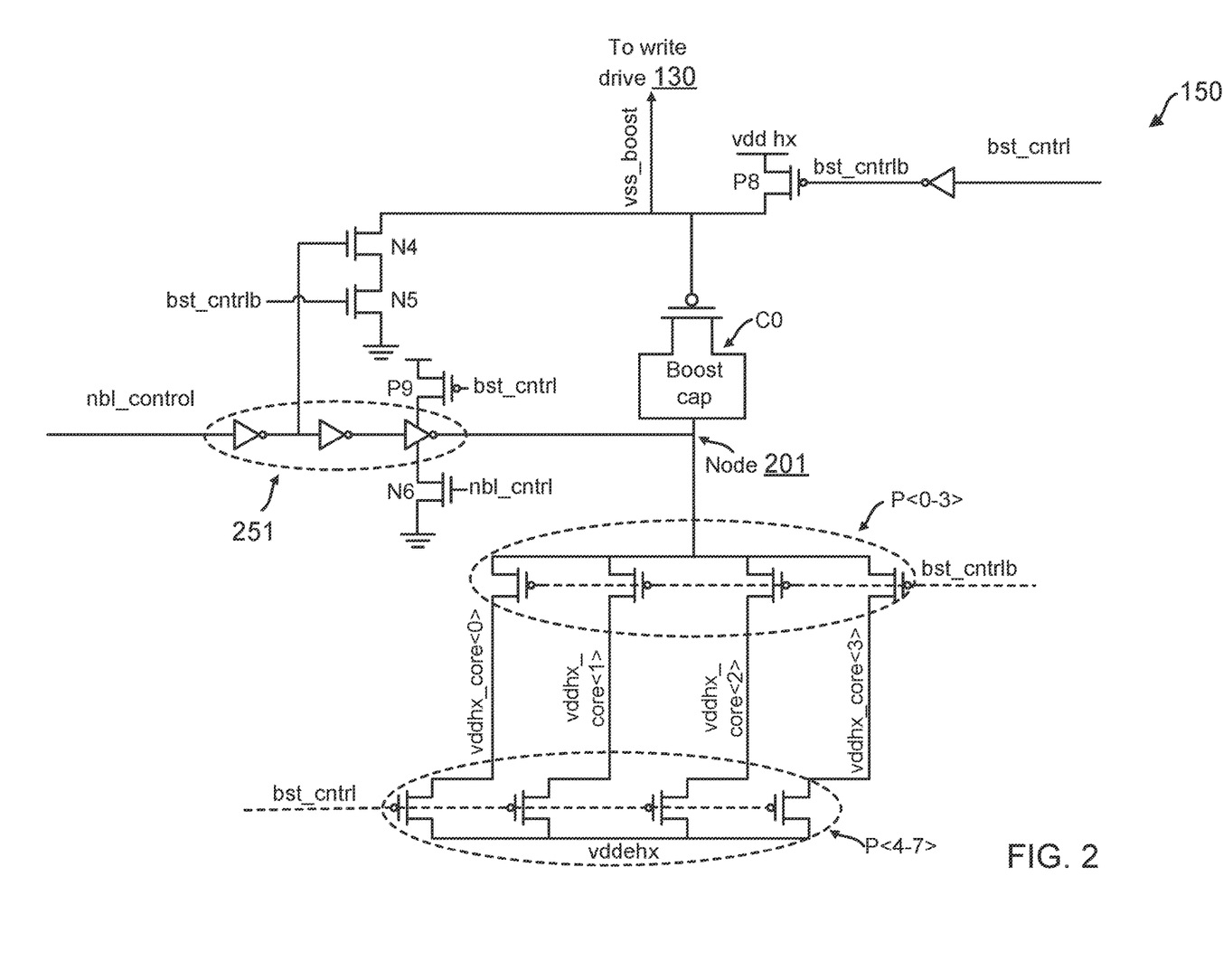
FIG. 2 illustrates an example boost circuit in the memory of FIG. 1.

FIG. 2 is an illustration of example boost circuit 150, according to one implementation. The capacitor C0 provides both negative boost to vss_boost as well as positive boost to the vddhx_core power rails.

This explanation looks at an example of a write operation with a negative boost first. Consider an example in which the input data gdin_n is 1 and gdin is 0. Boost circuit 150 makes vss_boost get as low as 0–$\Delta$v1 by using capacitor C0. Applying a 1 to the gates of transistors N4, N5 brings down the voltage at vss_boost to ground. Applying a 1 to the gates of transistors N4, N5 employs a 0 at signal nbl_control and a 1 at bst_cntrlb. The 0 value of nbl_control is applied to the series inverters 251 so that node 201 is also 1. Then the transistor N4 is turned off by applying a digital 0 at its gate (i.e., nbl_control goes to 1), which causes vss_boost to float, and node 201 transitions from 1 to 0 by virtue of the series inverters 251. This action applies further negative voltage at the node vss_boost by using capacitive coupling so that the node vss_boost get as low as 0–$\Delta$v1.

Figure 3:
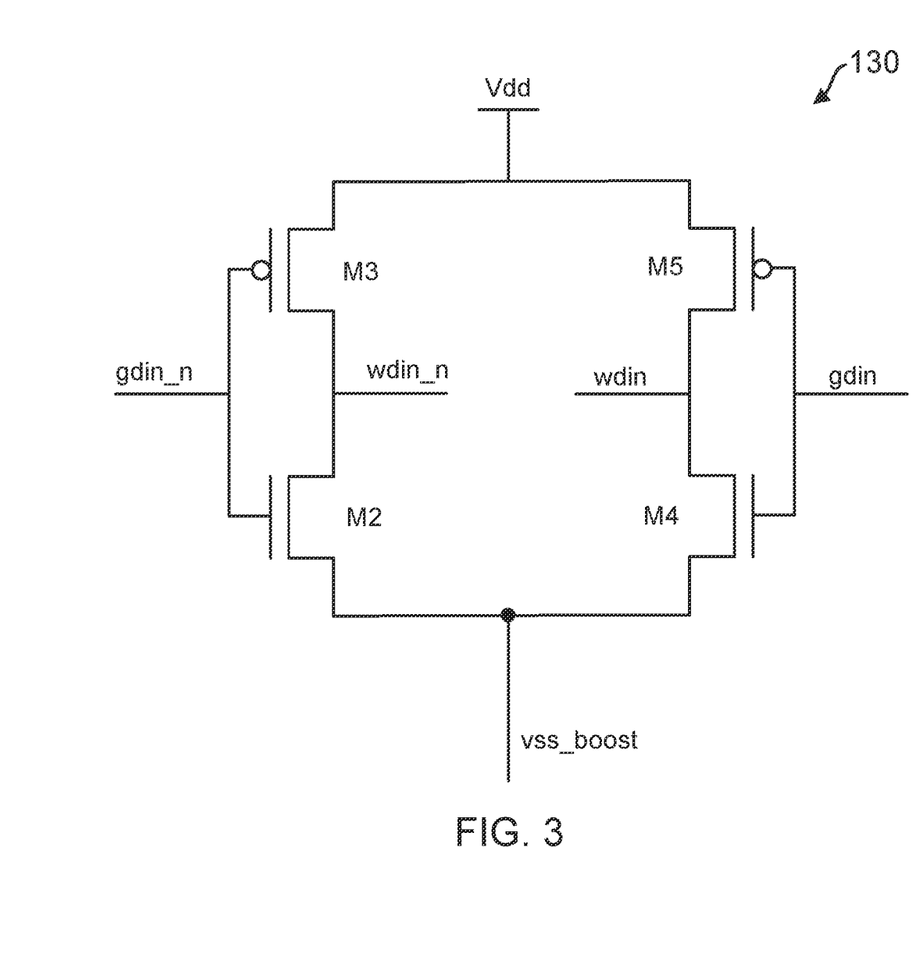
FIG. 3 illustrates an example write driver circuit in the memory of FIG. 1.

Operation of boost circuit 150 is further discussed with respect to FIG. 3. As noted above, in this example, gdin_n is 1 and gdin is 0. Transistor M5 is on, as is transistor M2, and transistors M3 and M4 are both off. Thus, wdin_n goes to vss_boost, whereas wdin goes to VDD. In an instance in which vss_boost is actually lower than Vss (e.g., ground), then the voltage level difference between the two data lines wdin, wdin_n is larger than VDD, which may be expected to lead to a higher write margin.

However, applying negative boost may lower the source voltage of the transistor M4, which may cause M4 to leak. Because of this leakage, it may become undesirable to lower the vss_boost more than a certain negative voltage level. In fact, increased leakage may not only cause undesirable power usage, but it may degrade write margin in some instances. Therefore, various implementations herein may use a size of capacitor C0 commensurate with a negative voltage boost that is not expected to result in an undesirable level of leakage.

Going back to FIG. 1, boost circuit 150 applies a positive boost to the power supply at both memory banks 195, 196 during a read operation. The positive boost increases a voltage of VDD to vddhx plus $\Delta$v2 by virtue of capacitor C0.

Looking at a read operation, nbl_control starts as 0 and remains at 0 for the duration of the read operation. As a result, N4 remains on, and N6 remains off and node 201 is pre-charged to VDD. The signal bst_cntrl starts as 0, which turns transistor P9 on, and transistors P8 is off. Transistor N5 is on, which pulls vss_boost to 0. At this point in time, node 201 corresponds to one terminal of capacitor C0 and is at VDD, and the other terminal of the capacitor C0 at node vss_boost is at 0.

Continuing with the example, transistors P<0-3> have a 1 applied to their gates, and they are off. Transistors P<4-7> have a 0 applied to their gates, and they are on, thereby charging the power rails vddhx_core<0-3> to VDD by virtue of the external, chip-level power supply vddehx.

When it is time to perform the read operation and discharge capacitor C0 for positive boost, the signal bst_cntrl transitions from 0 to 1. As bst_cntrl goes from 0 to 1, its complement (bst_cntrlb) goes from 1 to 0, thereby turning off N5. Transistor P9 turns off, and by default nbl_control is low and causes transistor N6 to be off as well.

When the signal bst_cntrl transitions from 0 to 1 (and bst_cntrlb transitions from 1 to 0) transistors P<0-3> and P8 turn on, and transistors P<4-7> turn off. As a result, the capacitor C0 transfers its charge to the power rails vddhx_core<0-3>, thereby raising the voltage of the power rails vddhx_core<0-3> to vddhx plus $\Delta v2$.

The positive boost ($\Delta v2$) may be any appropriate value, and in some instances, may be 50 to 100 mV. The size of the positive boost may be affected by selecting a capacitance for capacitor C0 commensurate with the desired $\Delta v2$. For instance, in one example implementation, effective total boost capacitance value is 10 fF, and effective total vddhx_core capacitance value is 320 fF (80 fF per bitcell column). Thus, $\Delta v2=10/(320+10)=3\%$ boost in this example, though the scope of implementations is not limited to any particular value for capacitance or voltage.

Figure 4:
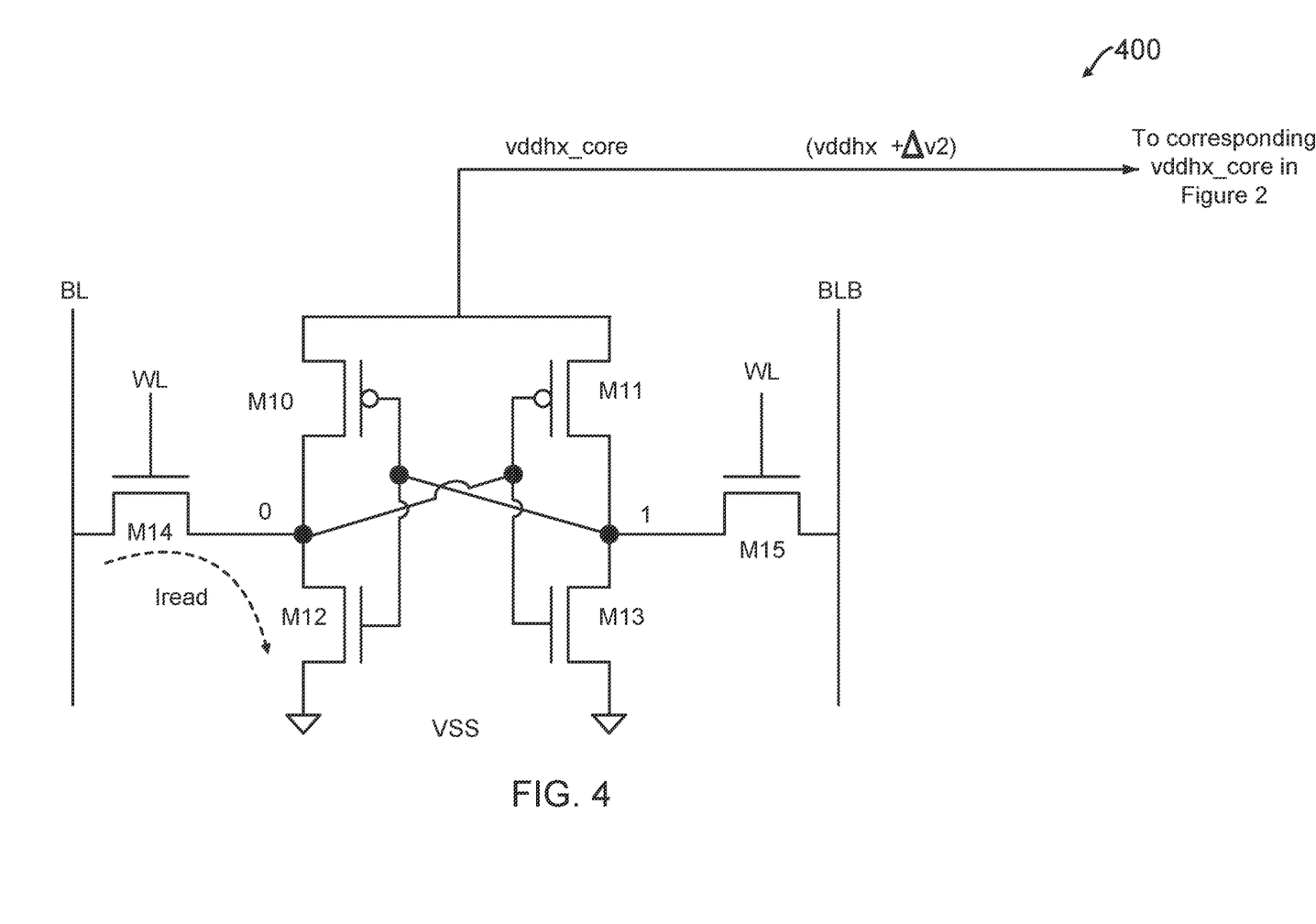
FIG. 4 illustrates an example memory cell in the implementation of FIG. 1.
Figure 5:
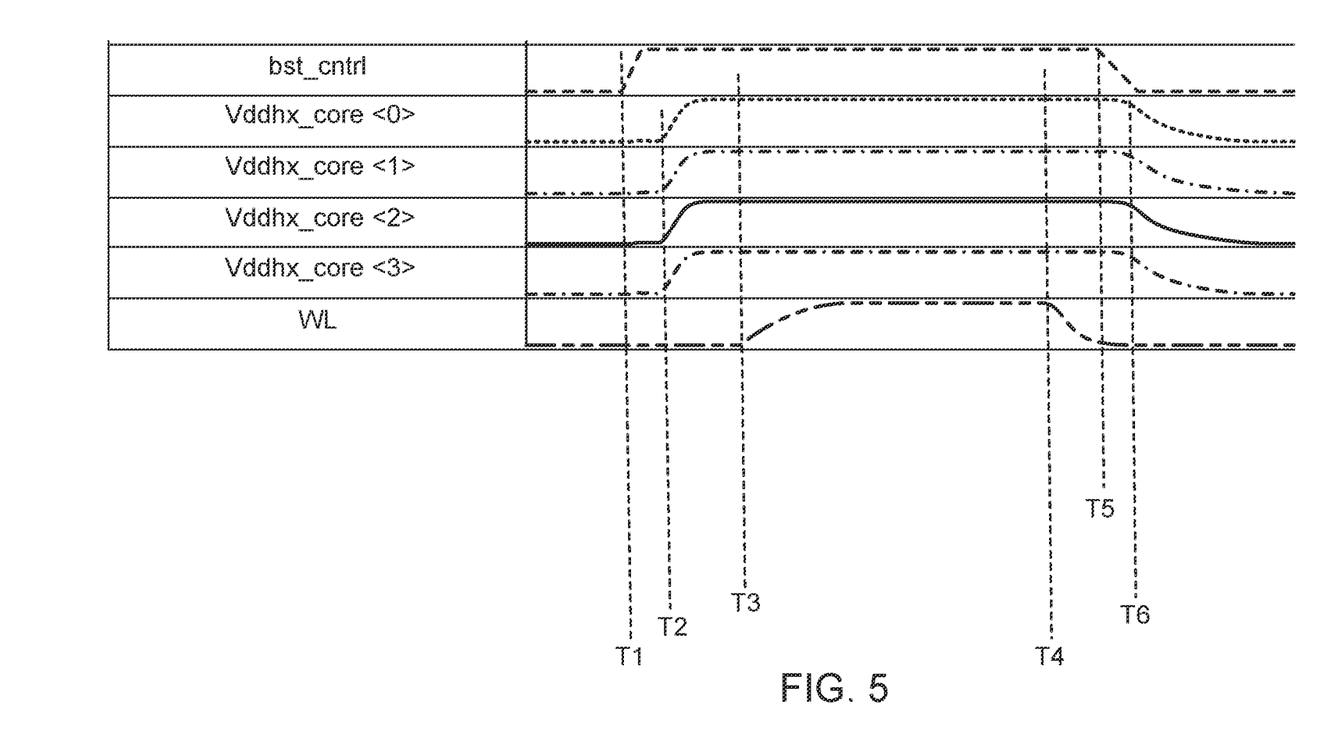
FIG. 5 illustrates an example timing diagram of the signals within the boost circuit and memory cell of FIGS. 2-4.

The read operation of the memory circuit, and more specifically the positive boost operation of boost circuit 150, is further illustrated by FIGS. 4-5. FIG. 4 illustrates an example memory cell according to one implementation.

In the example of FIG. 4, the memory cell 400 is a static random-access memory (SRAM) bit cell. In the architecture of FIG. 1, memory cells, such as bit cell 400, would be arranged in columns within the memory banks 195, 196. A particular memory bit cell may be selected by a given multiplexer 110, 120 using the multiplexing signals rm and wm.

Before a read operation, the bit lines BL and BLB are pre-charged to VDD but are floating. A given memory cell in a column may be selected according to its word line WL. Data is stored in the memory cell 400 using cross coupled transistors M10-M13. The cross coupled transistors are coupled between VSS (ground) and the power rail vddhx_core, which couples the memory cell 400 to a power supply.

Continuing with this example, transistor M10 receives at its gate a 1, transistor M11 receives at its gate a 0, transistor M12 receives at its gate a 1, and transistor M13 receives at its gate a 0.

As part of the read operation, the word line transistors M14, M15 receive digital 1 at their gates and turn on. The transistor M13 is off because its gate receives a 0. The boosted VDD is applied to the gate of M12, thereby turning M12 on, and the increased gate-source voltage at M12 results in an incrementally higher value for the read current Iread. Thus, the voltage at BL goes from VDD to VSS incrementally faster, and that faster response results in a differential voltage between BL and BLB so that the digital value stored in the memory cell 400 is more easily detected by sense amplifier 113 (FIG. 1).

Of course, the scenario illustrated in FIG. 4 is for one particular value stored in memory cell 400. A similar read operation would discharge BLB if the memory cell 400 stores the complementary value.

FIG. 5 is an illustration of an example signal timeline during a read operation and according to one implementation. FIG. 5 refers to the signals shown in FIG. 1 and FIG. 4.

Before time T1, bst_cntrl and WL are both digital 0. Similarly, the voltage at the power rails vddhx_core is at ground. During a read operation, bst_cntrl goes from 0 to 1 (and, correspondingly, bst_cntrlb goes from 1 to 0). As explained above, that turns on transistors P<0-3> and P8. At time T2, the voltages of the power rails vddhx_core begins to rise, eventually reaching VDD+$\Delta v2$ around time T3. The extra voltage boost ($\Delta v2$) is by virtue of the capacitor C0 discharging onto the voltage rails vddhx_core.

In one example, the level of VDD may be approximately 645 mV, and the boosted voltage level at the power rails vddhx_core may be approximately 665 mV, for a boost of approximately 3%. Of course, any appropriate boost level may be used in various implementations, and the size of the capacitor C0 may be selected to correspond to a desired boost level. For instance, a bigger capacitor size may lead to a larger boost of 5% or 10% in other examples. Similarly, a smaller boost of 2% or 1% may also be used as appropriate.

Furthermore, the various control signals (e.g., nbl_control, bst_cntrl, and their complements) may be provided by a memory controller or other control circuit (not shown). For instance, a memory controller or other control circuit may include digital logic that is implemented in the memory itself or in a processor, such as a central processing unit (CPU), graphics processing unit (GPU), or the like.

At time T3, the word line WL signal goes high as well, which turns on the transistors M14, M15 (FIG. 4) and allows either the BL or the BLB to discharge. The discharge of one of the bit lines creates the read current Iread, which affects a voltage that is sensed by the sense amplifier 113 (FIG. 1).

At time T4, the WL is de-asserted, and at time T5 the bst_contrl signal is also de-asserted. De-asserting bst_cntrl causes bst_cntrlb to go to digital 1, which turns off transistors P<0-3> and P8. At time T6, the voltages at the power rails vddhx_core are declining to ground.

Some implementations may include one or more advantages. For instance, simulation shows that using a nominal VDD with 5% VDD read boosting on read operations (as described above) may lead to an 8% increase in the read current Iread, a 6% improvement in access time, approximately no extra semiconductor area usage, and a power penalty of only 5%. Similarly, simulation shows that using a slightly reduced VDD with 5% VDD read boosting and WLUD provides a 10% increase in read current Iread, an access time improvement of 5%, approximately no extra semiconductor area usage, and the same power penalty of 5%. In other words, the boost circuits and methods described herein may be used to improve read signal noise margin and access time with only a small power penalty and almost no area penalty. The lack of area penalty may be achieved through re-using an existing capacitor in the design for positive VDD boosting at the memory cells.

Figure 6:
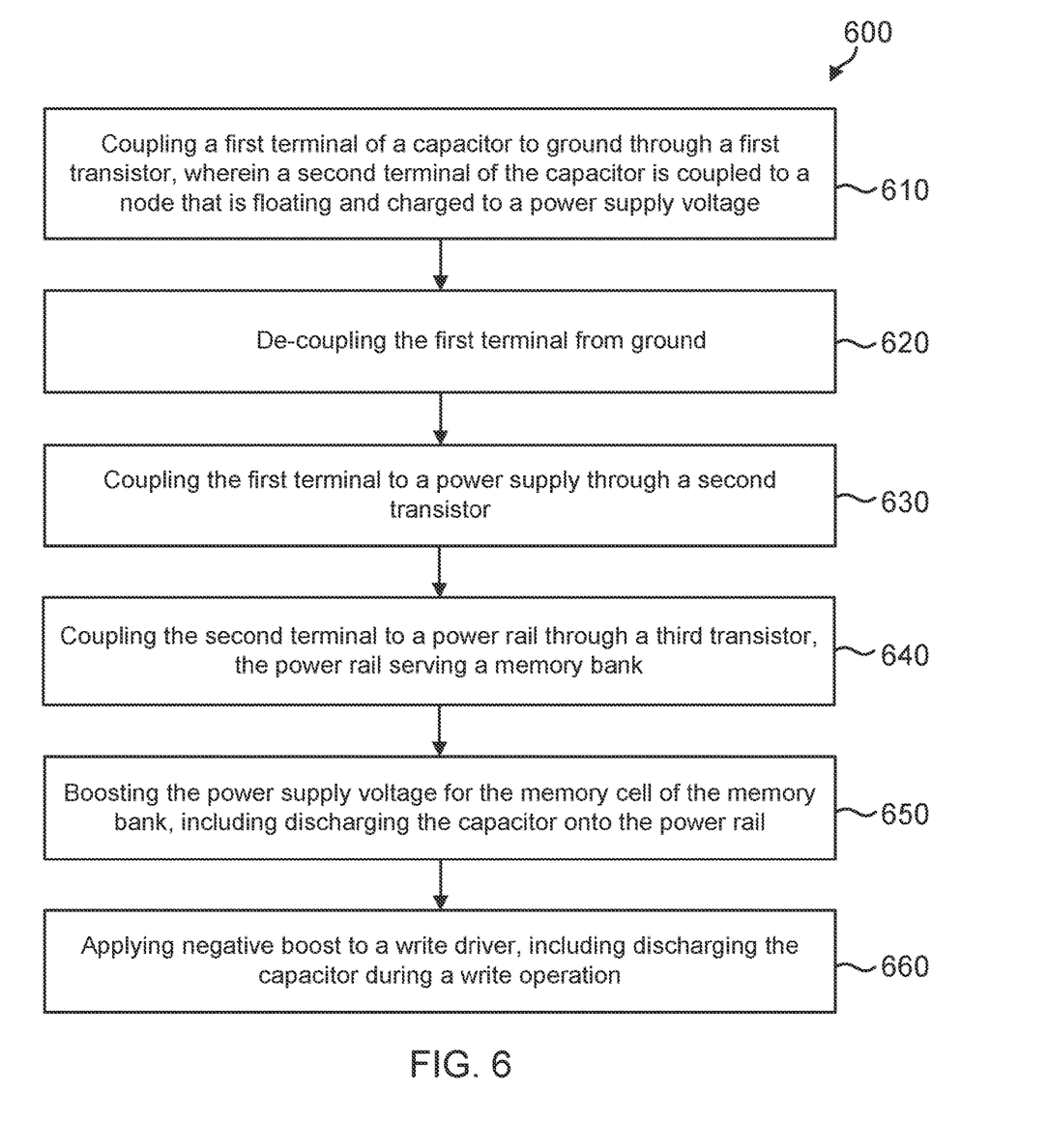
FIG. 6 illustrates a flowchart of an example method that may be performed by the memory of FIG. 1.

An example method for operating a memory device will now be discussed with reference to the flowchart shown in FIG. 6. The method 600 may be performed by a memory device, such as illustrated in FIG. 1 as it operates under control of a control circuit supplying the various control signals of FIGS. 1-4. In other words, the method 600 may be performed by a single- or multi-bank memory system having at least one boost capacitor.

At action 610, the method includes coupling a first terminal of a capacitor to ground through a first transistor. An example may include coupling capacitor C0 to ground through transistor N4. The second terminal of the capacitor is coupled to a node that is floating and charged to the power supply voltage, such as shown in FIG. 2, in which node 201 has been charged through the action of serial inverters 251.

At action 620, the method includes the first terminal is de-coupled from ground. For instance, transistor N4 may be turned off by changing a polarity of the signal nbl_control.

At action 630, the method includes coupling the first terminal to a power supply through a second transistor. For instance, the first terminal of capacitor C0 may be coupled to vddhx through transistor P8.

At action 640, the method includes coupling the second terminal of the capacitor to a power rail through a third transistor. Leading up to this point, node 201 may be floating, and then the transistors P<0-3> are turned on by the same signal that turned on transistor P8. The transistors P<0-3> coupled to the node 201 and the second terminal of the capacitor C0 to the power rails vddhx_core.

At action 650, the method includes boosting a power supply voltage of a memory cell of the memory bank. In the example of FIG. 2, the various power rails vddhx_core are coupled to memory banks and, via the memory banks, to the columns of memory cells.

The power rail in this example is coupled to a set of cross coupled transistors, such as is illustrated in FIG. 4. Specifically, the power rail is coupled to the cross coupled transistors at one end of the memory cell, and the other end of the memory cell is coupled to ground (e.g., VSS). The power rail provides a voltage to gates of two of the transistors in the memory cell at a time. The power rail is physically separate from the bit lines BL, BLB and the word line.

As a result of the boosted power supply, a transistor of the memory cell is turned on and passes a read current (e.g., Iread) from one of the bit lines to ground via source and drain of the transistor. A difference in voltage of the bit lines BL, BLB may allow the memory cell to be read by a sense amplifier.

At action 660, the method includes applying a negative boost to a write driver, including discharging the capacitor during a write operation. Specifically, in some implementations, the same capacitor may be used for both positive boosting during a read operation and negative boosting during a write operation. For instance, the capacitor C0 may be charged by being coupled to ground at its first terminal through the first transistor (e.g., N4 of FIG. 2) and being coupled to a power supply at its second terminal through, e.g., the series inverters 251. The first terminal may be then de-coupled from ground while applying a ground voltage to the second terminal by, e.g., changing a polarity of a control signal at the series inverters 251. As a result, a negative boost is applied to VSS at a write driver.

Of note in FIG. 2, the capacitor C0 is coupled at its first terminal to the node vss_boost, which is used to provide negative boosting to the write driver. The same capacitor C0 is coupled to the power rails vddhx_core by its second terminal. In other words, the same capacitor C0 can be charged and discharged in both read and write operations to provide a desired boost to either a writing circuit or a memory cell.

The scope of implementations is not limited to the series of actions described with respect to FIG. 8. Rather, other implementations may add, omit, rearrange, or modify one or more of the actions. For instance, during operation of the memory system, a read operation may be performed on the first memory bank or on the second memory bank and the subsequent read operation may then be performed on either the first memory bank or the second memory bank, and on and on. The read operations may or may not be interspersed with write operations, and the operations may repeat as appropriate. Also, some implementations may omit a negative boost during write operations.

Figure 7:
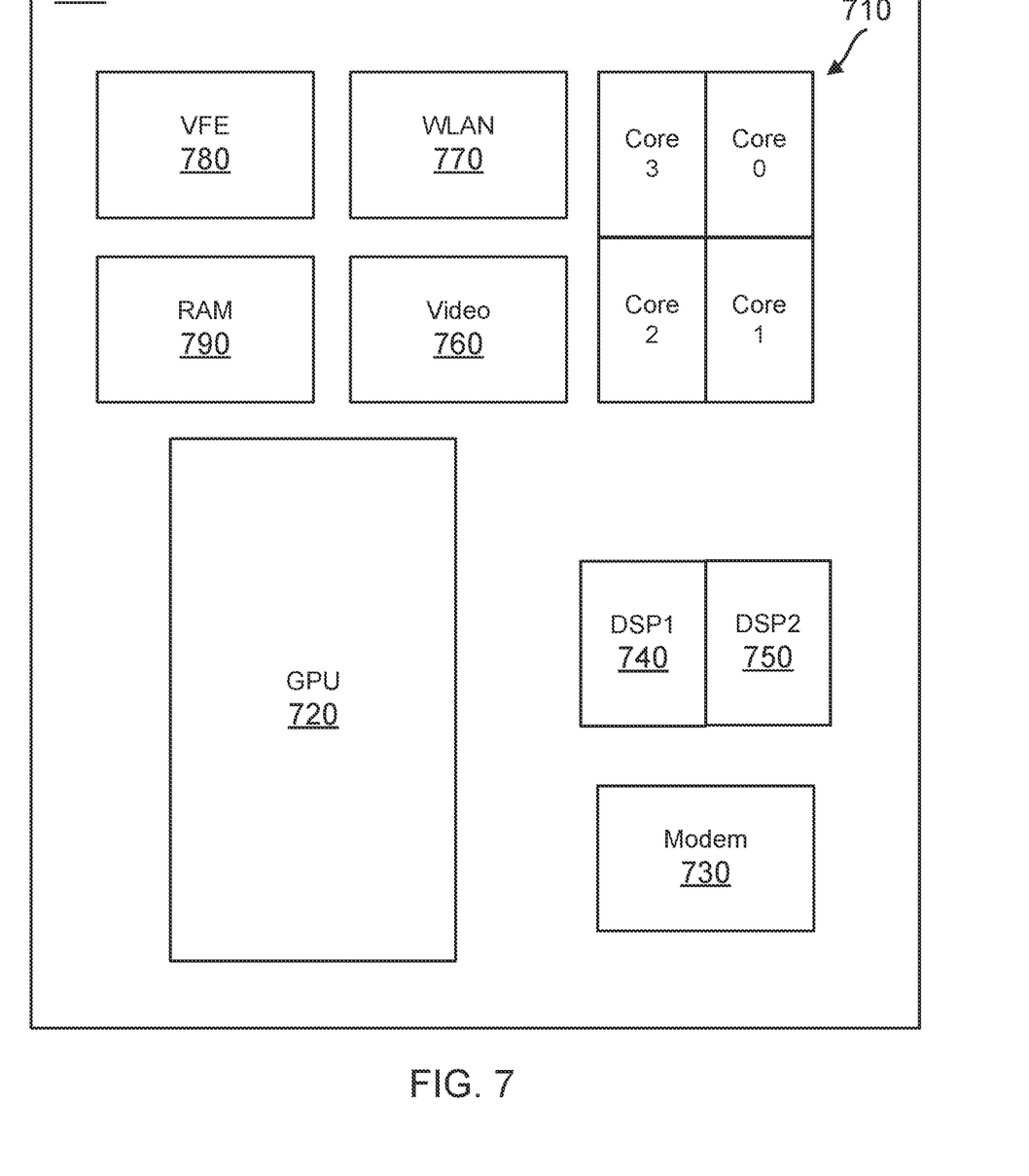
FIG. 7 illustrates an example system on chip (SOC) that may incorporate a memory according to an aspect of the disclosure.

FIG. 7 is an illustration of example SOC 700, according to one implementation. In this example, SOC 700 is implemented on a semiconductor die, and it includes multiple system components 710-770. Specifically, in this example, SOC 700 includes CPU 710 that is a multi-core general-purpose processor having four processor cores, core 0-core 3. Of course, the scope of implementations is not limited to any particular number of cores, as other implementations may include two cores, eight cores, or any other appropriate number of cores in the CPU 710. SOC 700 further includes other system components, such as a first digital signal processor (DSP) 740, a second DSP 750, a modem 730, GPU 720, a video subsystem 760, a wireless local area network (WLAN) transceiver 770, and a video-front-end (VFE) subsystem 780. SOC 700 also includes RAM memory unit 790, which may operate as system RAM for any of the components 710-780. For instance, RAM memory unit 790 may receive data and instructions from any of the components 710-780.

RAM memory unit 790 may include boost circuits, such as those described above with respect to FIGS. 1-5. Furthermore, RAM memory unit 790 may perform the actions of FIG. 6 to perform read and write operations.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

Implementation examples are described in the following numbered clauses:

1. A circuit comprising:
    a random-access memory (RAM) cell coupled to a first power rail; and
    a boost circuit coupled to the first power rail, the boost circuit including a capacitor having a first terminal and a second terminal, the first terminal of the capacitor being coupled to a first power supply through a first transistor and being coupled to a ground through a second transistor, the second terminal of the capacitor being coupled to a first plurality of parallel transistors, the first plurality of parallel transistors being coupled to a plurality of power rails that includes the first power rail, and a second plurality of parallel transistors coupled to the plurality of power rails and to a second power supply.

2. The circuit of clause 1, further comprising:
    a write driver coupled between the first power supply and the first terminal of the capacitor.

3. The circuit of clause 2, wherein the first transistor and the first terminal of the capacitor are coupled to the ground through the second transistor and a third transistor, wherein the first transistor and the third transistor are gate-coupled to a first signal, and wherein the second transistor is gate-coupled to a second signal.

4. The circuit of clause 3, wherein the first plurality of parallel transistors are gate-coupled to the first signal, and wherein the second plurality of parallel transistors are gate-coupled to a complement of the first signal.

5. The circuit of clause 4, wherein the first transistor comprises a p-type metal oxide semiconductor (PMOS) device, and wherein the second transistor comprises an n-type metal oxide semiconductor (NMOS) device.

6. The circuit of clause 4, wherein the first plurality of parallel transistors comprises p-type metal oxide semiconductor (PMOS) devices, and wherein the second plurality of parallel transistors comprise PMOS devices.

7. The circuit of clause 4, wherein the capacitor comprises a p-type metal oxide semiconductor (PMOS) transistor that is gate-coupled to the first transistor, the second transistor, and the write driver.

8. The circuit of clause 7, wherein a source of the PMOS transistor and a drain of the PMOS transistor are coupled to either sources or drains of the first plurality of parallel transistors, and wherein the second terminal of the capacitor is coupled to the second signal through a plurality of inverters.

9. The circuit of any of clauses 1-8, wherein each power rail of the plurality of power rails corresponds to a respective memory core of a plurality of memory cores, wherein the RAM cell corresponds to a first memory core of the plurality of memory cores and corresponds to a first column of the first memory core.

10. A method of operating a memory system, the method comprising:
coupling a first terminal of a capacitor to ground through a first transistor, wherein a second terminal of the capacitor is coupled to a node that is floating and charged to a power supply voltage;
de-coupling the first terminal from ground;
coupling the first terminal to a power supply through a second transistor;
coupling the second terminal to a power rail through a third transistor, the power rail serving a memory bank; and
boosting the power supply voltage for a memory cell of the memory bank, including discharging the capacitor onto the power rail.

11. The method of clause 10, wherein coupling the first terminal to ground through the first transistor includes charging the capacitor according to a first polarity.

12. The method of any of clauses 10-11, further comprising:
reading a bit stored in the memory cell, including discharging a bit line through a fourth transistor, the fourth transistor being gate-coupled to the power supply voltage of the memory cell.

13. The method of any of clauses 10-12, wherein boosting the power supply voltage of the memory cell is performed during a read operation of the memory bank.

14. The method of any of clauses 10-13, further comprising:
coupling the first terminal to ground through the first transistor while coupling the second terminal to the power supply through a series of inverters;
de-coupling the first terminal from ground while coupling the second terminal to ground; and
applying a negative boost to a write driver, including discharging the capacitor during a write operation of the memory system.

15. The method of clause 14, wherein applying the negative boost to the write driver includes:
reducing a source voltage of a fourth transistor at the write driver to a value below a ground value.

16. The method of any of clauses 10-15, wherein the first transistor comprises a n-type metal oxide semiconductor (NMOS) device, wherein the second transistor comprises a p-type metal oxide semiconductor (PMOS) device, and wherein the third transistor comprises a PMOS device.

17. A random access memory (RAM) comprising:
a first memory bank having a plurality of bit cells arranged in columns and rows;
means for conforming a voltage level of input data to a level compatible with writing to the first memory bank;
means for detecting output data read from the first memory bank;
means for providing a negative boost to the means for conforming the voltage level; and
means for providing a positive boost to power rails coupled to memory cells in the first memory bank.

18. The RAM of clause 17, wherein the means for providing the negative boost and the means for providing the positive boost share a capacitor.

19. The RAM of any of clauses 17-18, wherein the means for providing the negative boost comprises:
a capacitor having a first terminal and a second terminal, the first terminal of the capacitor being coupled to a first power supply through a first transistor and being coupled to a ground through a second transistor, 20. The RAM of clause 19, wherein the means for providing the positive boost comprises:
a first plurality of parallel transistors coupled to the second terminal of the capacitor, the first plurality of parallel transistors being coupled to the power rails; and
a second plurality of parallel transistors coupled to the power rails and to a second power supply.

21. The RAM of clause 20, wherein the first transistor and the first terminal of the capacitor are coupled to the ground through the second transistor and a third transistor, wherein the first transistor and the third transistor are gate-coupled to a first signal, and wherein the second transistor is gate-coupled to a second signal.

22. The RAM of clause 21, wherein the first plurality of parallel transistors are gate-coupled to the first signal, and wherein the second plurality of parallel transistors are gate-coupled to a complement of the first signal.

23. The RAM of clause 22, wherein the first transistor comprises a p-type metal oxide semiconductor (PMOS) device, and wherein the second transistor comprises an n-type metal oxide semiconductor (NMOS) device.

24. The RAM of clause 22, wherein the first plurality of parallel transistors comprises p-type metal oxide semiconductor (PMOS) devices, and wherein the second plurality of parallel transistors comprise PMOS devices.

25. The RAM of clause 22, wherein the capacitor comprises a p-type metal oxide semiconductor (PMOS) transistor that is gate-coupled to the first transistor, the second transistor, and the means for conforming the voltage level.

26. The RAM of clause 25, wherein a source of the PMOS transistor and a drain of the PMOS transistor are coupled to either sources or drains of the first plurality of parallel transistors, and wherein the second terminal of the capacitor is coupled to the second signal through a plurality of inverters.

27. A system on chip (SOC) comprising:
   a random access memory having a write driver and a memory bank;
   a plurality of power rails, each of the power rails corresponding to a respective core within the memory bank, each of the power rails being coupled to power inputs of memory cells within the respective cores; and
   a boost circuit coupled to the write driver and to the memory bank, wherein the boost circuit includes a capacitor having a first terminal and a second terminal, the capacitor being coupled between a power supply and a first node, the first node being coupled to the second terminal and to the plurality of power rails.

28. The SOC of clause 27, wherein the boost circuit further comprises:
   a first transistor coupling the first terminal of the capacitor to ground; and
   a plurality of series inverters coupling the second terminal of the capacitor to the power supply.

29. The SOC of clause 28, wherein the first terminal of the capacitor is coupled to either sources or drains of transistors of the write driver.

30. The SOC of clause 27, wherein the plurality of power rails are coupled to a non-ship voltage source through a first plurality of transistors, the first plurality of transistors being gate coupled to a signal that is also gate coupled to a transistor coupling the first terminal of the capacitor to the power supply.

What is claimed is:

1. A circuit comprising:
   a random-access memory (RAM) cell coupled to a first power rail; and
   a boost circuit coupled to the first power rail, the boost circuit including a capacitor having a first terminal and a second terminal, the first terminal of the capacitor being coupled to a first power supply through a first transistor and being coupled to a ground through a second transistor, the second terminal of the capacitor being coupled to a first plurality of parallel transistors, the first plurality of parallel transistors being coupled to a plurality of power rails that includes the first power rail, and a second plurality of parallel transistors coupled to the plurality of power rails and to a second power supply.

2. The circuit of claim 1, further comprising:
   a write driver coupled between the first power supply and the first terminal of the capacitor.

3. The circuit of claim 2, wherein the first transistor and the first terminal of the capacitor are coupled to the ground through the second transistor and a third transistor, wherein the first transistor and the third transistor are gate-coupled to a first signal, and wherein the second transistor is gate-coupled to a second signal.

4. The circuit of claim 3, wherein the first plurality of parallel transistors are gate-coupled to the first signal, and wherein the second plurality of parallel transistors are gate-coupled to a complement of the first signal.

5. The circuit of claim 4, wherein the first transistor comprises a p-type metal oxide semiconductor (PMOS) device, and wherein the second transistor comprises an n-type metal oxide semiconductor (NMOS) device.

6. The circuit of claim 4, wherein the first plurality of parallel transistors comprises p-type metal oxide semiconductor (PMOS) devices, and wherein the second plurality of parallel transistors comprise PMOS devices.

7. The circuit of claim 4, wherein the capacitor comprises a p-type metal oxide semiconductor (PMOS) transistor that is gate-coupled to the first transistor, the second transistor, and the write driver.

8. The circuit of claim 7, wherein a source of the PMOS transistor and a drain of the PMOS transistor are coupled to either sources or drains of the first plurality of parallel transistors, and wherein the second terminal of the capacitor is coupled to the second signal through a plurality of inverters.

9. The circuit of claim 1, wherein each power rail of the plurality of power rails corresponds to a respective memory core of a plurality of memory cores, wherein the RAM cell corresponds to a first memory core of the plurality of memory cores and corresponds to a first column of the first memory core.

10. A random access memory (RAM) comprising:
    a first memory bank having a plurality of bit cells arranged in columns and rows;
    means for conforming a voltage level of input data to a level compatible with writing to the first memory bank;
    means for detecting output data read from the first memory bank;
    means for providing a negative boost to the means for conforming the voltage level, wherein the means for providing the negative boost comprises
       a capacitor having a first terminal and a second terminal, the first terminal of the capacitor being coupled to a first power supply through a first transistor and being coupled to a ground through a second transistor; and
    means for providing a positive boost to power rails coupled to memory cells in the first memory bank.

11. The RAM of claim 10, wherein the means for providing the negative boost and the means for providing the positive boost share a capacitor.

12. The RAM of claim 10, wherein the means for providing the positive boost comprises:
    a first plurality of parallel transistors coupled to the second terminal of the capacitor, the first plurality of parallel transistors being coupled to the power rails; and
    a second plurality of parallel transistors coupled to the power rails and to a second power supply.

13. The RAM of claim 12, wherein the first transistor and the first terminal of the capacitor are coupled to the ground through the second transistor and a third transistor, wherein the first transistor and the third transistor are gate-coupled to a first signal, and wherein the second transistor is gate-coupled to a second signal.

14. The RAM of claim 13, wherein the first plurality of parallel transistors are gate-coupled to the first signal, and wherein the second plurality of parallel transistors are gate-coupled to a complement of the first signal.

15. The RAM of claim 14, wherein the first transistor comprises a p-type metal oxide semiconductor (PMOS) device, and wherein the second transistor comprises an n-type metal oxide semiconductor (NMOS) device.

16. The RAM of claim 14, wherein the first plurality of parallel transistors comprises p-type metal oxide semiconductor (PMOS) devices, and wherein the second plurality of parallel transistors comprise PMOS devices.

17. The RAM of claim 14, wherein the capacitor comprises a p-type metal oxide semiconductor (PMOS) transistor that is gate-coupled to the first transistor, the second transistor, and the means for conforming the voltage level.

18. The RAM of claim 17, wherein a source of the PMOS transistor and a drain of the PMOS transistor are coupled to either sources or drains of the first plurality of parallel transistors, and wherein the second terminal of the capacitor is coupled to the second signal through a plurality of inverters.

19. A system on chip (SOC) comprising:
   a random access memory having a write driver and a memory bank;
   a plurality of power rails, each of the power rails corresponding to a respective core within the memory bank, each of the power rails being coupled to power inputs of memory cells within the respective core; and
   a boost circuit coupled to the write driver and to the memory bank, wherein the boost circuit includes a capacitor having a first terminal and a second terminal, the capacitor being coupled between a power supply and a first node, the first node being coupled to the second terminal and to the plurality of power rails, wherein the boost circuit further includes
   a first transistor coupling the first terminal of the capacitor to ground, and
   a plurality of series inverters coupling the second terminal of the capacitor to the power supply.

20. The SOC of claim 19, wherein the first terminal of the capacitor is coupled to either sources or drains of transistors of the write driver.

21. The SOC of claim 19, wherein the plurality of power rails are coupled to an external chip-level voltage source through a first plurality of transistors, the first plurality of transistors being gate coupled to a signal that is also gate coupled to a transistor coupling the first terminal of the capacitor to the power supply.

* * * * *